United States Patent [19]

Ohtani et al.

[11] Patent Number: 4,594,519
[45] Date of Patent: Jun. 10, 1986

[54] LOW POWER CONSUMPTION, HIGH SPEED CMOS SIGNAL INPUT CIRCUIT

[75] Inventors: Takayuki Ohtani, Tokyo; Tetsuya Iizuka, Chiba, both of Japan

[73] Assignee: Tokyo Shibaura Denki Kabushiki Kaisha, Kawasaki, Japan

[21] Appl. No.: 534,691

[22] Filed: Sep. 22, 1983

[30] Foreign Application Priority Data

Oct. 25, 1982 [JP] Japan .................... 57-187278

[51] Int. Cl.[4] ............... H03K 19/003; H03K 19/094; H03K 19/20
[52] U.S. Cl. .................... 307/443; 307/451; 307/473; 307/481
[58] Field of Search .............. 307/200 B, 352, 353, 307/443, 451, 452, 473, 475, 481

[56] References Cited

U.S. PATENT DOCUMENTS

| | | | |
|---|---|---|---|
| 3,745,731 | 7/1973 | Suzuki | 377/79 |
| 3,766,408 | 10/1973 | Suzuki et al. | 307/279 X |
| 3,989,955 | 11/1976 | Suzuki | 307/481 X |
| 4,329,600 | 5/1982 | Stewart | 307/473 X |
| 4,350,906 | 9/1982 | Gillberg | 307/473 X |
| 4,435,658 | 3/1984 | Murray et al. | 307/473 X |
| 4,449,064 | 5/1984 | Eckert et al. | 307/473 |
| 4,465,945 | 8/1984 | Yin | 307/473 |

FOREIGN PATENT DOCUMENTS 166739 10/1982 Japan .................... 307/200 B

Primary Examiner—Larry N. Anagnos
Attorney, Agent, or Firm—Cushman, Darby & Cushman

[57] ABSTRACT

A signal input circuit particularly well suited for use in MOS integrated circuits. The signal input circuit includes: and input gate circuit for receiving an input signal and an enable control signal, and for generating an output signal equal to the input signal when the enable control signal is in an "enable" state, and for providing a high output impedance when the enable control signal is in a "disable" state; and a holding circuit coupled to an output of the input gate circuit and to receiving the enable control signal, for holding, during the disable state, the output state of the input gate circuit immediately before the enable control signal changes to a disable state, the output impedance being high when the enable control signal is in an enable state.

9 Claims, 6 Drawing Figures

LOW POWER CONSUMPTION, HIGH SPEED CMOS SIGNAL INPUT CIRCUIT

BACKGROUND OF THE INVENTION

This invention relates to a digital signal input circuit constituted by a semiconductor integrated circuit, and more particularly, to a signal input circuit suitable for use in a MOS memory integrated circuit and in MOS logical integrated circuit design.

Static Random Access Memory (hereinafter referred to a "SRAM") devices include an address transition detector, which is non-synchronous with an outer circuit and synchronous with an inner circuit. These have been developed for decreasing power consumption while increasing the packaging density. For achieving high speed while increasing packaging density, there has been developed the SRAM Large Scale Integrated Circuit (hereinafter referred to as "LSI"). However, problems occur in SRAM involving the address transition detector. These problems relate to a peak current of the power source flowing when the chip enable signal changes. A malfunction of a signal input circuit in a Row Address Buffer circuit is one cause of such problems.

FIG. 1 (PRIOR ART) shows a Row Address Buffer circuit having the signal input circuit conventionally used in MOS LSI Memory circuits. FIG. 2 (PRIOR ART) shows signals used in the signal input circuit of FIG. 1.

In FIG. 1, a signal input circuit 1 includes a NOR gate 2 which goes high at a disable state of $\overline{CE}$, used as an enable control signal. Since the output of NOR gate 2 is normally clamped to a low level at a disable state, the current path between the power source $V_{DD}$ (not shown) of the gate 2 and the ground potential $V_{SS}$ (not shown) is interrupted.

There is no problem when the input signal (i) is high and the enable control signal $\overline{CE}$ is in the enable state. The output (A) of NOR gate 2 continues to be low and the output of the signal input circuit 1 does not change when the enable control signal $\overline{CE}$ changes to a low level from a high level, or to a high level from a low level. An internal circuit inputted by the output of NOR gate 2 is not activated and no power consumption is caused. However, a problem occurs when the input signal (i) is low when the enable control signal $\overline{CE}$ changes to a high level from a low level. That is because the output (node A) of NOR gate 2 changes to a low level from a high level when the enable control signal $\overline{CE}$ changes to a high level. This signal is the same signal that would be generated if the input signal (i) were to change to a high level. The change of (A) from low to high level is propagated in the internal circuit, such as for example, an address pre-decoder 4, and an address transition detector 6. As a result, the internal circuit is activated and power consumption is caused thereby. After that, when the enable control signal $\overline{CE}$ changes to the low level (enable state) and the input signal (i) is a low level, the output (A) of NOR gate 2 changes to a high level from a low level. This change of the signal is transmitted to the internal circuit. The delay time for this change is the same time as that required for a change of the input signal i.

Furthermore, when the delay time from the formation of the enable control signal $\overline{CE}$ by a chip input control signal to its arrival at the input gate of circuit 1 shown in FIG. 1 is included, the access time, in the case where the internal circuit is accessed by the change in control signal $\overline{CE}$, is delayed as compared with the time required when the signal input was changed, notwithstanding the fact that the signal input is not changed at low level. The changes occur in each of the gates from the input stage to the internal circuit, whereby a large amount of electric power is consumed.

Furthermore, as shown in FIG. 1, when the enable control signal $\overline{CE}$ changes slowly and the output B of the signal input circuit 1 crosses a response voltage of the transition detector 6, an output of the address transition detector changes. As a result, bit lines of the LSI memory are pre-charged as a bit line signal $\phi_{ij}$ changes, and the read operation occurs and the data output buffers are activated. A large amount of current flows through some circuits in MOS LSI for this pre-charge. A power source noise is generated in MOS LSI for this current. The electric potential of node B is fluctuated by the power source noise. Then, since the output of the signal input circuit crosses the response voltage, the transition detector responds again. By this phenomenon the bit lines are precharged, the power source noise is generated and the electric potential of node B is fluctuated again. This process is repeated many times. The pre-charge and the read operation is repeated and the electric power is wasted. In MOS LSI memory, when the enable control signal $\overline{CE}$ is the disable state, the MOS LSI memory is usually supported by a battery back-up system. However, the power consumption caused by the abnormal operation mentioned above cannot be corrected by the battery back-up system.

SUMMARY OF THE INVENTION

An object of the present invention is to provide a signal input circuit which has a smaller power consumption and a shorter access time.

The signal input circuit according to the present invention comprises an input gate circuit which receives an input signal and an enable control signal as the inputs and provides an output which is equal to the input signal when the enable control signal is in an enable state, the output impedance of which is high when the enable control signal is in a disable state; and a holding circuit which receives the output of the input gate circuit and the enable control signal as the inputs, which holds, during the disable state, the state of output of the input gate circuit immediately before the enable control signal changes into a disable state, the output impedance being high when the enable control signal is in an enable state.

DETAILED DESCRIPTION OF THE PREFERRED EMBODIMENT

The present invention will now be described in further detail.

Figure 3:
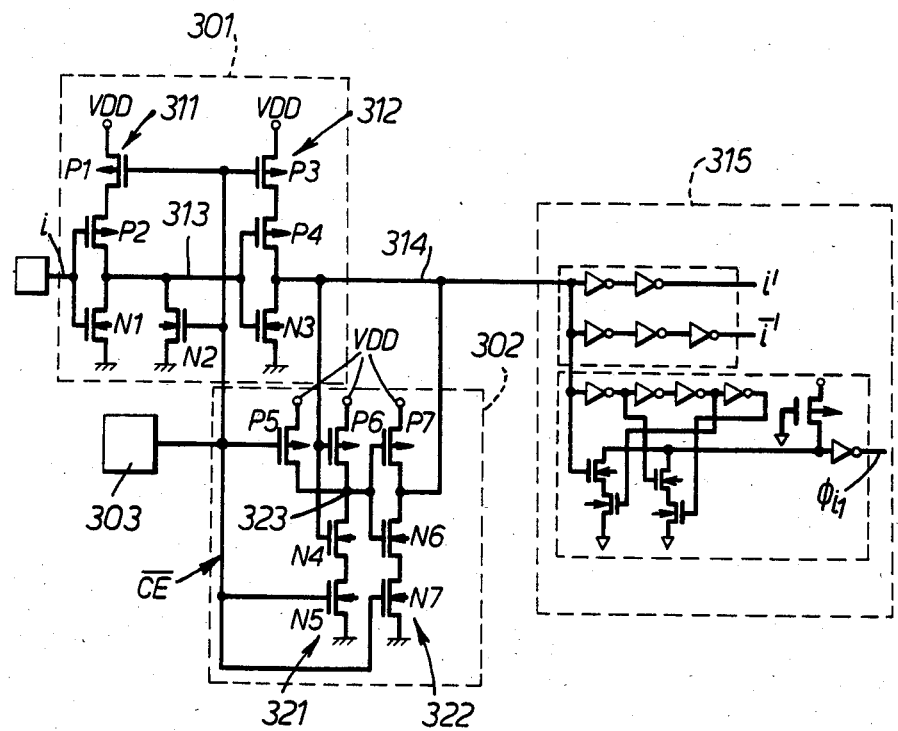
FIG. 3 is a circuit illustrating a first embodiment of the signal input circuit in accordance with the invention.

FIG. 3 shows one embodiment of this invention. The signal input circuit of this embodiment comprises an input gate circuit 301 and a holding circuit 302. An enable control signal $\overline{CE}$ is supplied to these circuits from a control circuit 303. In this embodiment, a control signal $\overline{CE}$ is used which is at a low level at the enable state, and is at a high level at the disable state. The input gate circuit 301 and the holding circuit 302 are formed by MOSFET (hereinafter referred to simply as transistors) P1 through P7 and N1 through N7 connected as shown in FIG. 3, respectively. P1 through P7 are P channel transistors, and N1 through N7 are N channel transistors, respectively.

Input gate circuit 301 comprises a first gate 311 acting as a NOR gate for the input signal i and the control signal $\overline{CE}$, and the second gate 312 comprising inverter (P4, N3) inputting the output (node 313) of the first gate and the transistor P3, which has the same channel type as the transistor P4 of the inverter, and is connected in series to the transistor P4. The gate of transistor P3 is provided with the control signal $\overline{CE}$ and is forced OFF by a disable state of the control signal. The output (node 314) of the inverter (P4, N3) is supplied to the internal circuit 315 as the output of the input gate circuit 301.

The holding circuit 302 comprises the first gate 321 acting as a NAND gate for the output of the input gate circuit 301 and the control signal $\overline{CE}$, and the second gate 322 comprising inverter (P7, N6) inputting the output (node 323) of the first gate 321, and a transistor N7 having the same channel type as the transistor N6 of the inverter and connected in series with the transistor N6. The transistor N7 is supplied with the control signal $\overline{CE}$ to the gate, and becomes OFF in an enable state. The output of the inverter (P7, N6) is connected to the node 314.

When the control signal $\overline{CE}$ is in an enable state, that is, at a low level, P1, P3 of the input gate circuit 301 turn ON, and N2 turns OFF, and the first gate 311 operates as an inverter for the input signal i. The inverter (P4, N3) of the second gate 312 delivers a reversed output of the first gate 311 (node 313). On the other hand, N5, N7 of the holding circuit 302 turn OFF and P5 turns ON whereby the output impedance of the second gate 322 is increased. As the result, the output of the input gate circuit 301 is supplied to the internal circuit 315.

When the control signal $\overline{CE}$ is turned to a disable state, that is, to a high level, N5, N7 of the holding circuit 302 are turned ON, and the P5 is turned OFF. As a result, the first gate 321 acts as an inverter to the output of the input gate circuit 301. Further, the inverter (P7, N6) of the second gate 322 reverses the output of the first gate 321 and returns it to the node 314. On the other hand, P1, P3 of the input gate circuit 301 are turned OFF, and the output impedance of the second gate 312 is increased. As a result, the holding circuit 302 holds the output of the input gate circuit 301 immediately before the control signal $\overline{CE}$ is disabled, since the output of the holding circuit 302 is coupled to the node 314 and the node 314 is the output of the second gate 312. This holding action is continued until $\overline{CE}$ is turned to the subsequent enable state. Thus, since the output of the input gate circuit 301, i.e., the input of the internal circuit 315, is held at a constant level and the internal circuit does not change, the power in the internal circuit is not substantially consumed, even if the input signal i is at a low level when the enable control signal $\overline{CE}$ is restored to the enable state, and a signal having the same level as the input signal is held in the input node 314 of the internal circuit 315, thereby the access time is shortened.

Figure 1:
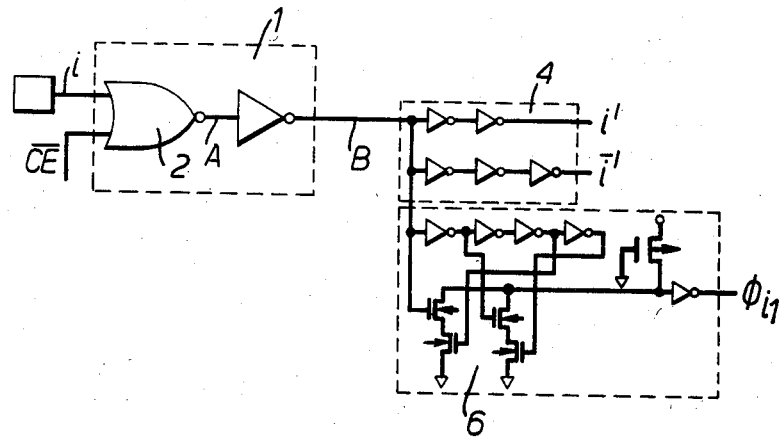
FIG. 1 (PRIOR ART) is an equivalent circuit of a conventional signal input circuit.
Figure 2:
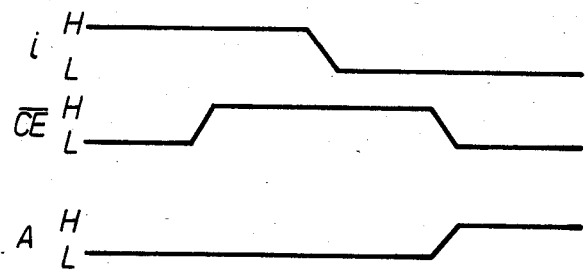
FIG. 2 (PRIOR ART) shows signals used in the prior art signal input circuit shown in FIG. 1.

Also, when the control signal $\overline{CE}$ changes slowly, the power source noise still occurs since the node B as shown in FIG. 1 fluctuates, whereby the prior art input circuit does not use the battery back up system. But, in the present invention the address transition detector does not respond and the fluctuation of the node 314 is prevented since the output of the input gate circuit 301 is held at a constant level.

Figure 4:
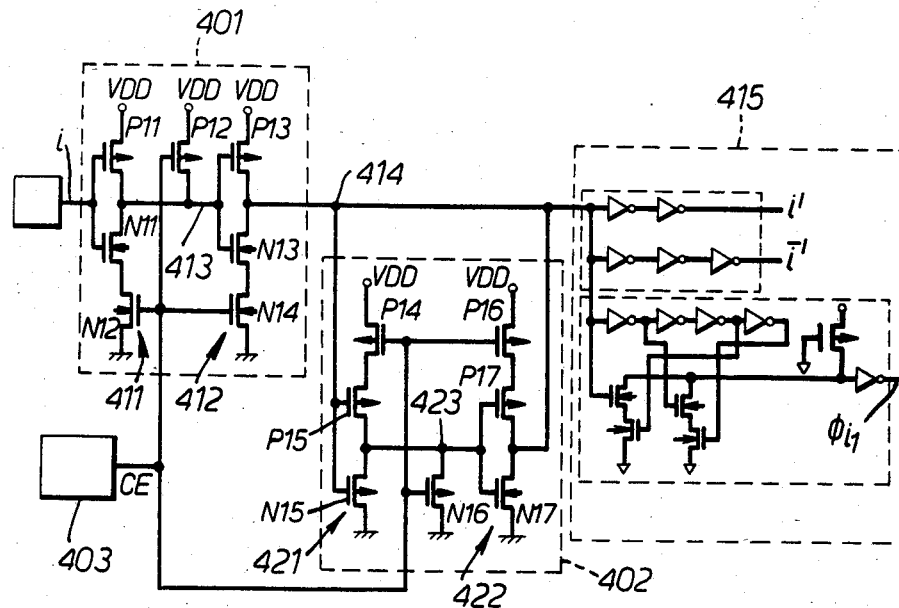
FIG. 4 is a circuit illustrating a second embodiment of the signal input circuit in accordance with the invention.

FIG. 4 shows another embodiment of the present invention, this embodiment is controlled by a control signal CE which has a high level in an enable state and has a low level in a disable state. The input gate circuit 401 and the holding circuit 402 have transistors P11 through P17, N11 through N17, connected respectively as shown in FIG. 4.

The input circuit 401 in this embodiment also has a first gate 411 and a second gate 412, but in this case, the first gate 411 operates as a NAND gate for the input signal i and the control signal CE. The second gate 412 is formed by an inverter (P13, N13) which supplies the output of the first gate 411 (node 413), and a transistor N14 having the same channel type as transistor N13 and connected in series with transistor N13. The transistor N14 is supplied with the control signal CE to its gate, and is turned OFF when CE is disabled.

The holding circuit 402 has a first gate 421 and a second gate 422, but the first gate 421 acts as NOR gate for the output of the input gate circuit 401 and for the control signal CE. The second gate 422 comprises an inverter (P17, N17) which supplies the output of the first gate 421 (node 423), and a transistor P16 having the same channel types as transistor P17 and connected in series with transistor P17. The transistor P16 is supplied with the control signal CE to its gate, and is turned OFF when CE is enabled.

The operation of the input signal circuit in the embodiment shown in FIG. 4 is substantially the same as that of the embodiment shown in FIG. 3.

Figure 5:
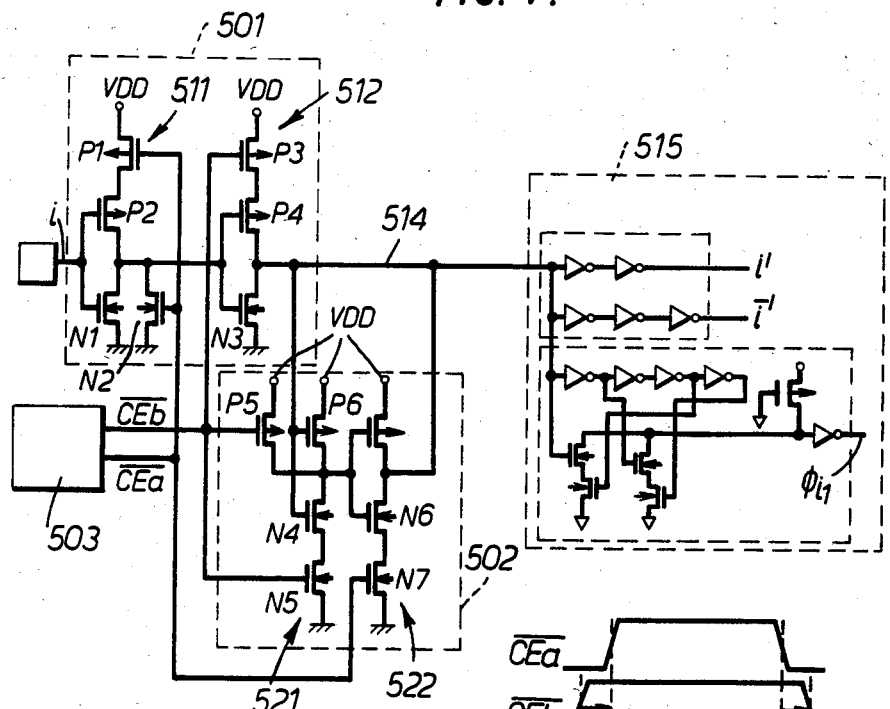
FIG. 5 is a circuit illustrating a third embodiment of the signal input circuit in accordance with the invention.
Figure 6:
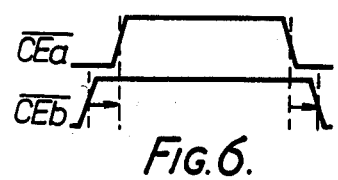
FIG. 6 shows the operation timing waveforms of an enable signal of FIG. 5.

FIGS. 5 and 6 show still another embodiment of this invention. In this embodiment, as shown in FIG. 6, the control circuit 503 supplies a first control signal $\overline{CEa}$ and a second control signal $\overline{CEb}$. $\overline{CEb}$ changes into a disable state a little earlier than the first control signal $\overline{CEa}$ and into an enable state a little later than the first control signal $\overline{CEa}$. The first control signal $\overline{CEa}$ is supplied to the first gate 511 of the input gate circuit 501 and to the transistor N7 of the second gate 522 in the holding circuit 502. On the other hand, the second control signal $\overline{CEb}$ is supplied to the first gate 521 in the holding circuit 502 and to the transistor P3 of the second gate 512 in the input gate circuit 501.

The other aspects of the circuit arrangement and operation are substantially the same as the embodiment shown in FIG. 3, but are different in the following two points:

In the case of the embodiment shown in FIG. 3,
(a) the phenomenon that, because of the high level of the input signal, when the control signal is changed from the enable state to the disable state, the level of the node 314 (which should be maintained at a high level) falls temporarily to a low level by the passing-through of N6 and N7, and further, the phenomenon that the holding circuit 302 holds the output state of the input gate circuit at a low level, and (b) the phenomenon that, the level of the node 314 (which should originally be maintained at low level) is raised temporarily to a high level by the passing-through of P3, P4 when the level of the input signal is low, and the control signal is changed from the disable state to the enable state, are likely to occur. However according to the embodiment shown in FIG. 5, since the leading edge of the control signal $\overline{CEb}$ arrives earlier than that of $\overline{CEa}$, the phenomenon described in (a) above is avoided. Since the trailing edge of the control signal $\overline{CEb}$ arrives later than that of $\overline{CEa}$, the phenomenon described in (b) above is avoided. As described previously, when the control signal is switched, since the level of the input terminal to the internal circuit is maintained at a constant value, decrease in the power consumption and curtailment of access time will further be ensured.

As described above, according to the present invention, since the output of the input gate circuit 1, i.e. the input of the internal circuit, is held at a constant level and the internal circuit does not change, the power in the internal circuit is not substantially consumed, even if the input signal i is at a low level when the enable control signal $\overline{CEa}$, $\overline{CEb}$ is restored to the enable state, and even if a signal having the same level as the input signal is held in the input node of the internal circuit. In addition to reduced power consumption, the access time is shortened.

Also, when the control signal $\overline{CE}$ changes slowly, the power source noise still occurs since the output node B of the input signal circuit as shown in FIG. 1 fluctuates, whereby the prior art input circuit does not use the battery back up system. But, in the present invention the address transition detector does not respond and the electric potential of the input signal circuit output is prevented from fluctuating because the output of the input gate circuit is held at a constant level.

Furthermore, when the present invention is applied to a shift register, the input signal circuit of this invention may use only one signal in comparison with the prior art shift register, for example as shown in U.S. Pat. No. 3,745,371.

While the invention has been described in connection with what is presently considered to be the most practical and preferred embodiments, it is to be understood that the invention is not to be limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

What we claim is:

1. A CMOS signal input circuit having first and second voltage terminals with a current flow therebetween, comprising:
    input gate means for (a) receiving an input signal and for providing an output voltage level at an output terminal in response to said input signal, (b) receiving an enable control signal which transitions between two possible logic states including an "enable" state and a "disable" state, and (c) interrupting said current flow when said enable control signal is in said "disable" state, said input gate means including:
      a first gate controlled by said input signal and having an output;
      a first MOS transistor having a first type channel and coupled in series with said first gate between said first voltage terminal and said second voltage terminal, said first MOS transistor being controlled by said enable control signal;
      a second gate having an input and controlled by said output of said first gate and providing said output voltage level of said input gate means;
      a second MOS transistor having a first type channel and coupled in series with said second gate between said first voltage terminal and said second voltage terminal, said second MOS transistor being controlled by said enable control signal; and
      a third MOS transistor, having a second type channel which is a type opposite to said first type channel, connected between said input of said second gate and said second voltage terminal, said third MOS transistor being controlled by said enable signal; and
    holding means coupled to said output terminal of said input gate means and enabled during the disabled state of said enable control signal, for holding the value of said output terminal to a voltage level which is attained at a time period substantially immediately before said transition of said enable control signal from said "enable" state to said "disable" state.

2. A signal input circuit according to claim 1 wherein said holding means comprises:
    a third gate controlled by the voltage level at said output terminal of said input gate means and having an output;
    a fourth MOS transistor having said second type channel and coupled in series with said third gate between said first voltage terminal and said second voltage terminal, said fourth MOS transistor being controlled by said enable control signal;
    a fourth gate, having an input and an output terminal, controlled by said output of said third gate and connected at its output to said input gate means output terminal;
    a fifth MOS transistor having said second type channel and coupled in series with said fourth gate between said first and second voltage terminals, said fifth MOS transistor being controlled by said enable control signal; and
    a sixth MOS transistor having said first type channel, connected between said input terminal of said fourth gate and said first voltage terminal, said sixth MOS transistor being controlled by said enable signal.

3. A CMOS signal input circuit having first and second voltage terminals with a current flow therebetween, comprising:
    input gate means for (a) receiving an input signal and for providing an output voltage level at an output terminal in response to said input signal, (b) receiving an enable control signal which transitions between two possible logic states including an "enable" state and a "disable" state, and (c) interrupting said current flow when said enable control signal is in said "disable" state; and holding means, coupled to said output terminal of said input gate means and enabled during the disable state of said enable control signal, for holding the value of said output terminal to a voltage level which is attained at a time period substantially immediately before said transition of said enable control signal from said "enable" state to said "disable" state, said holding means including:
  a first gate controlled by the voltage level at said output terminal of said input gate means and having an output;
  a first MOS transistor having a first type channel and coupled in series with said first gate between said first voltage terminal and said second voltage terminal, said first MOS transistor being controlled by said enable control signal;
  a second gate, having an input and an output terminal, controlled by said output of said first gate and connected at its output to said input gate means output terminal;
  a second MOS transistor having said first type channel and coupled in series with said second gate between said first and second voltage terminals, said second MOS transistor being controlled by said enable control signal; and
  a third MOS transistor, having a second type channel which is a type opposite said first type channel, connected between said input terminal of said second gate and said first voltage terminal, said third MOS transistor being controlled by said enable control signal.

4. A CMOS signal input circuit, having a first and second voltage terminal with a current flowing therebetween, controlled by a first enable control signal and a second enable control signal each of which may change between a disable state and an enable state, comprising:
  input gate means for receiving an input signal and providing an output voltage level at an output terminal in response to said input signal and being responsive to said first and said second enable control signals for interrupting said current flowing between said first voltage terminal and said second voltage terminal when said first and said second enable control signals are both in said disable state; and
  holding means for receiving the output voltage level at said output terminal of said input gate means, enabled during the disabled state of said enabled control signals, for holding the voltage level of said output terminal which is attained at a time period substantially immediately prior to a time when said first and said second enable control signals change to said disable state.

5. A signal input circuit according to claim 4 wherein said second enable control signal changes into said disable state earlier than said first enable control signal and changes into said enable state from said disable state later than said first enable control signal.

6. A signal input circuit according to claim 4 wherein said input gate means comprises:
  a first gate controlled by said first enable control signal and providing an output signal;
  a first MOS transistor connected to said first gate and having a first type channel and coupled in series with said first gate between said first and said second voltage terminals, said first MOS transistor being controlled by said first enable control signal;
  a second gate, having an input terminal and an output terminal, controlled by said output signal of said first gate and connected at its output to said input gate means output terminal;
  a second MOS transistor connected to said second gate and having said first type channel and coupled in series with said second gate between said first and said second voltage terminals, said second MOS transistor being controlled by said second enable control signal;
  a third MOS transistor, having a second type channel which is a type opposite to said first type channel, connected between said input terminal of said second gate and said second voltage terminal, said third MOS transistor being controlled by said first enable signal.

7. A signal input circuit according to claim 6 wherein said second enable control signal changes into said disable state earlier than said first enable control signal and changes into said enable state from said disable state later than said first enable control signal.

8. A signal input circuit according to claim 4 wherein said holding means comprises:
  a first gate controlled by said output voltage level of said input gate means and providing an output signal;
  a first MOS transistor having a first type channel and coupled in series with said first gate between said first and said second voltage terminals, said first MOS transistor being controlled by said second enable signal;
  a second gate, having an input and an output terminal, controlled by said output signal of said first gate and connected at its output terminal to said input gate means output terminal;
  a second MOS transistor connected to said second gate and having said first type channel and coupled in series with said second gate between said first and said second voltage terminals, said second MOS transistor being controlled by said first enable signal; and
  a third MOS transistor, having a second type channel which is a type opposite said first type channel, connected between said input terminal of said second gate and said first voltage terminal, said third MOS transistor being controlled by said second enable signal.

9. A signal input circuit according to claim 8 wherein said second enable control signal changes into said disable state earlier than said first enable control signal and changes into said enable state from said disable state later than said first enable control signal.

* * * * *